United States Patent
Baba et al.

(10) Patent No.: US 10,672,673 B2
(45) Date of Patent: Jun. 2, 2020

(54) METHOD OF PERFORMING ANALYSIS OF PATTERN DEFECT, IMPRINT APPARATUS, AND ARTICLE MANUFACTURING METHOD

(71) Applicant: CANON KABUSHIKI KAISHA, Tokyo (JP)

(72) Inventors: Norikazu Baba, Utsunomiya (JP); Kiyohito Yamamoto, Utsunomiya (JP)

(73) Assignee: CANON KABUSHIKI KAISHA, Tokyo (JP)

(*) Notice: Subject to any disclaimer, the term of this patent is extended or adjusted under 35 U.S.C. 154(b) by 390 days.

(21) Appl. No.: 15/451,759

(22) Filed: Mar. 7, 2017

(65) Prior Publication Data

US 2017/0263510 A1    Sep. 14, 2017

(30) Foreign Application Priority Data

Mar. 10, 2016 (JP) ................. 2016-047366

(51) Int. Cl.
 *H01L 21/66* (2006.01)
 *G03F 7/00* (2006.01)
 (Continued)

(52) U.S. Cl.
 CPC ............. *H01L 22/24* (2013.01); *B05D 3/12* (2013.01); *G03F 7/0002* (2013.01);
 (Continued)

(58) Field of Classification Search
 CPC ..... H01L 22/24; H01L 22/12; H01L 21/0271; B05D 3/12; G05B 19/41875; G05B 2219/32194; G03F 7/0002; Y02P 90/22
 See application file for complete search history.

(56) References Cited

U.S. PATENT DOCUMENTS

| 8,891,080 B2 | 11/2014 | Khusnatdinov et al. |
| 9,046,763 B2 | 6/2015 | Koshiba et al. |
| 2017/0363969 A1* | 12/2017 | Hauptmann ............. G03F 1/84 |

FOREIGN PATENT DOCUMENTS

| JP | 2010225693 A | 10/2010 |
| JP | 2013539204 A | 10/2013 |

(Continued)

OTHER PUBLICATIONS

Hiroshima et al 2003 Jpn. J. Appl. Phys. 42, 3849.*

(Continued)

*Primary Examiner* — James M Mellott
(74) *Attorney, Agent, or Firm* — Rossi, Kimms & McDowell LLP

(57) ABSTRACT

There is provided a method of performing an analysis of a defect in a pattern of an imprint material on a substrate that has undergone an imprint process of transferring a pattern of a mold onto the substrate. The method includes obtaining a defect distribution of the pattern on the substrate, obtaining map information indicating an arrangement of the imprint material on the substrate, and determining a type of a defect based on a relationship between a position of the defect in the defect distribution and a position of a gap in the imprint material generated in a process of spreading the imprint material by the imprint process, wherein the position of the gap is predicted based on the map information.

7 Claims, 13 Drawing Sheets

(51) Int. Cl.
*B05D 3/12* (2006.01)
*G05B 19/418* (2006.01)
*H01L 21/027* (2006.01)

(52) U.S. Cl.
CPC .... *G05B 19/41875* (2013.01); *H01L 21/0271* (2013.01); *G05B 2219/32194* (2013.01); *H01L 22/12* (2013.01); *Y02P 90/22* (2015.11)

(56) References Cited

FOREIGN PATENT DOCUMENTS

| | | |
|---|---|---|
| JP | 2015026671 A | 2/2015 |
| WO | 2012006531 A2 | 1/2012 |

OTHER PUBLICATIONS

Perez et al. Proc. of SPIE vol. 6517, 65170L (2007).*
English translation of Office Action issued in Japanese Appln. No. 2016-047366 dated Nov. 15, 2019, previously cited in IDS filed Nov. 27, 2019.

* cited by examiner

F I G. 10
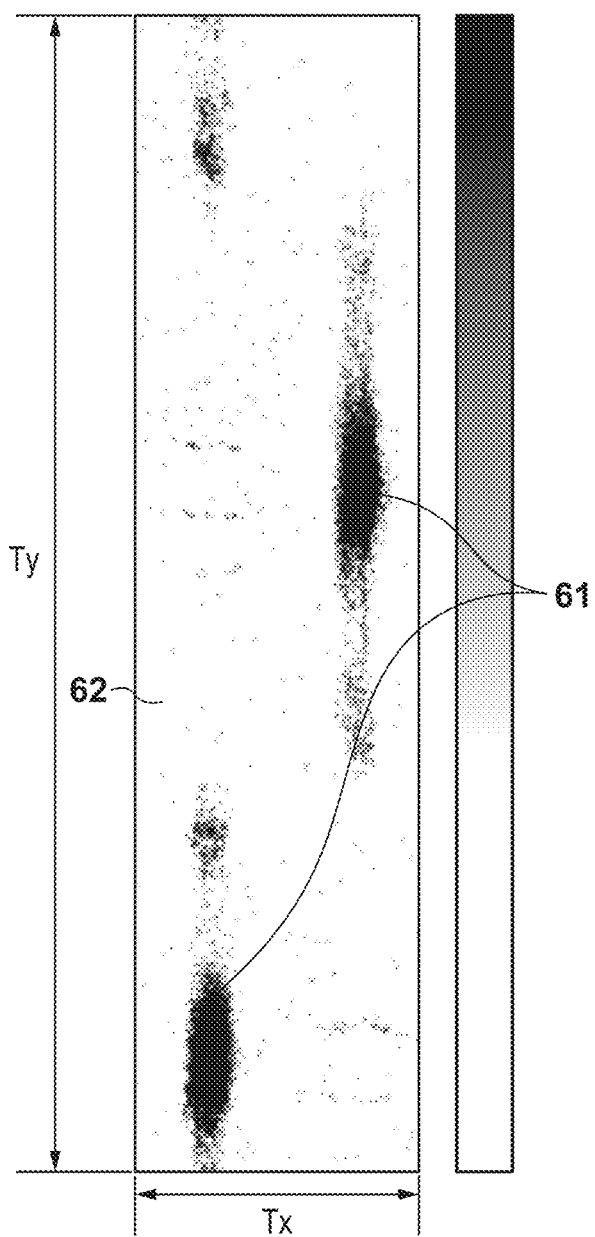

METHOD OF PERFORMING ANALYSIS OF PATTERN DEFECT, IMPRINT APPARATUS, AND ARTICLE MANUFACTURING METHOD

BACKGROUND OF THE INVENTION

Field of the Invention

The present invention relates to an analysis of a pattern defect, an imprint apparatus, and an article manufacturing method.

Description of the Related Art

An imprint technique is coming into practical use as one lithography technique of manufacturing articles such as magnetic storage media and semiconductor devices. In an imprint apparatus, a pattern is formed by bringing a mold into contact with an imprint material on a substrate. A pattern defect may be caused at this time, and a reduction in this defect is a task.

One factor in causing the pattern defect is that bubbles are trapped between the mold and the imprint material on the substrate when a pattern portion of the mold and the imprint material are brought into contact with each other. If the imprint material is cured while the bubbles remain, a defect may be caused in the formed pattern due to insufficient filling.

Another factor in causing the pattern defect is that foreign particles (foreign substances) adhere to a pattern surface. If the particles adhere to the pattern surface, the pattern formed on the substrate is distorted, causing a transfer defect.

There are a plurality of causes of the pattern defect as described above, and thus different measures need to be taken for the respective causes of the defects. Japanese Patent Laid-Open No. 2010-225693 describes a technique of determining a defect due to insufficient filling if a defect size is large and correcting the arrangement amount of imprint materials. In addition, Japanese Patent Laid-Open No. 2013-539204 describes a technique of taking measures to grasp the periodicity and total number of defect data by an FFT analysis, and clean a substrate if the total number exceeds a reference.

In the technique of Japanese Patent Laid-Open No. 2010-225693, however, there are many determination errors because the size of a defect region is used as grounds for determining the defect due to insufficient filling, and thus the effect of reducing the defect is small. In the technique of Japanese Patent Laid-Open No. 2013-539204, the measures are not taken by classifying defects for the respective causes, and thus the effect of reducing the defect is also small.

SUMMARY OF THE INVENTION

The present invention provides a technique advantageous in reducing a pattern defect.

According to one aspect of the present invention, there is provided a method of performing an analysis of a defect in a pattern of an imprint material on a substrate that has undergone an imprint process of transferring a pattern of a mold onto the substrate by bringing the pattern of the mold into contact with the imprint material on the substrate and curing the imprint material. The method includes obtaining a defect distribution of the pattern on the substrate, obtaining map information indicating an arrangement of the imprint material on the substrate, and determining a type of a defect based on a relationship between a position of the defect in the defect distribution and a position of a gap in the imprint material generated in a process of spreading the imprint material by the imprint process, wherein the position of the gap is predicted based on the map information.

Further features of the present invention will become apparent from the following description of exemplary embodiments (with reference to the attached drawings).

BRIEF DESCRIPTION OF THE DRAWINGS

FIG. 10 is a view showing a defect density distribution;

DESCRIPTION OF THE EMBODIMENTS

Various exemplary embodiments, features, and aspects of the invention will be described in detail below with reference to the drawings.

Embodiments of the present invention will be described in detail below with reference to the accompanying drawings. Note that the following embodiments are not intended to limit the present invention and are merely concrete examples in practicing the invention. Also, not all combinations of features to be described in the embodiments are indispensable for the means to solve the problems according to the present invention.

First Embodiment

Figure 1:
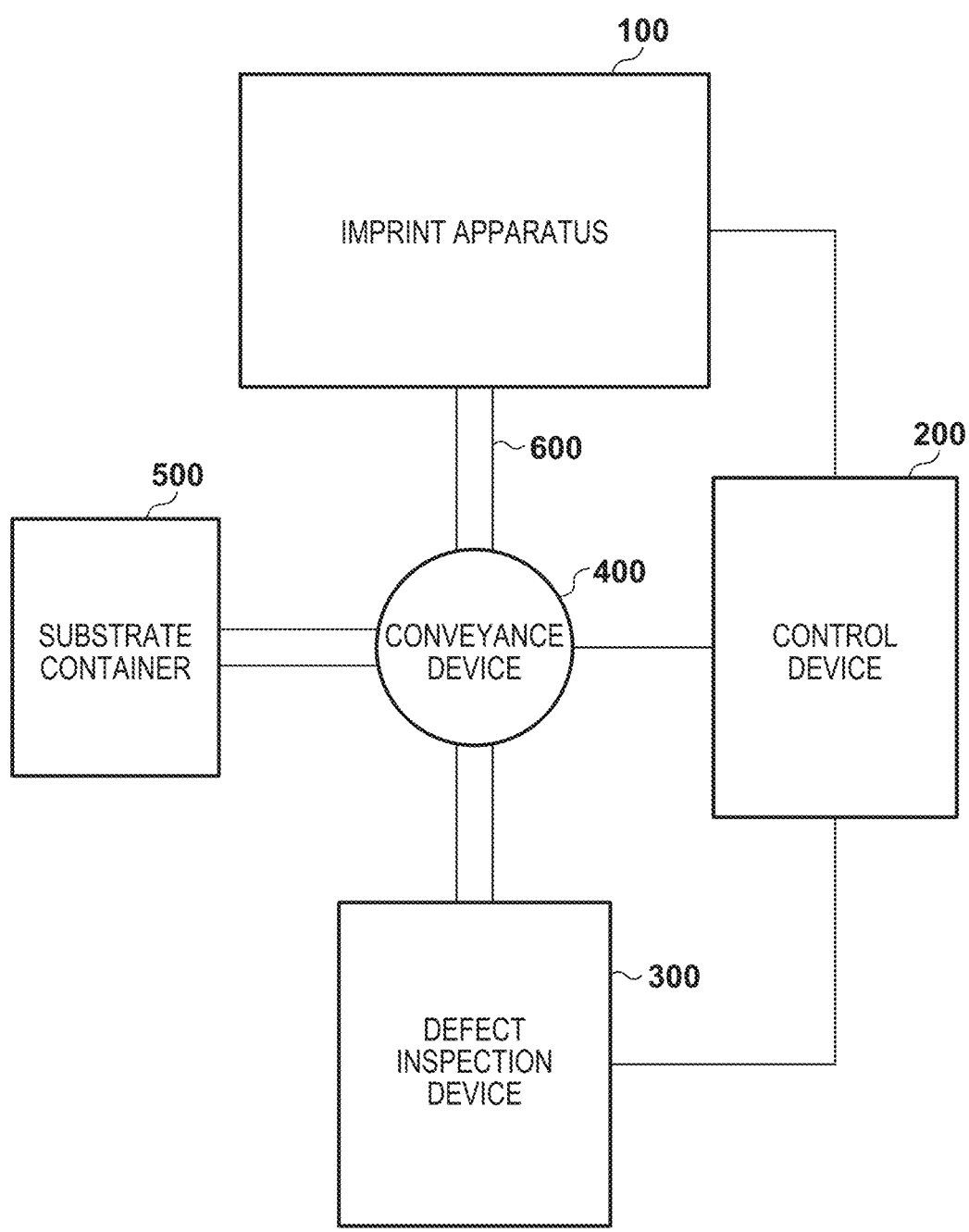
FIG. 1 is a block diagram showing an example of the arrangement of an imprint system according to an embodiment.

FIG. 1 shows an example of the arrangement of an imprint system according to this embodiment. The imprint system includes an imprint apparatus 100, a control device 200, a defect inspection device 300, a substrate container 500, and a conveyance device 400. The imprint apparatus 100 brings a pattern formed in a mold into contact with an imprint material on a substrate to cure the imprint material, thereby transferring the pattern onto the substrate. The defect inspection device 300 inspects a defect in the pattern that has been formed on the substrate processed by the imprint apparatus 100. The defect inspection device 300 can be an optical defect inspection device but may be an electron beam defect inspection device. The substrate container 500 stores an unprocessed substrate and a processed substrate. The conveyance device 400 conveys the substrate among the imprint apparatus 100, the defect inspection device 300, and the substrate container 500 via conveyance paths 600. The control device 200 is a computer device which comprehensively controls the operations of the imprint apparatus 100, the defect inspection device 300, and the conveyance device 400 and also functions as a device for performing defect reduction processing to be described later.

Figure 2:
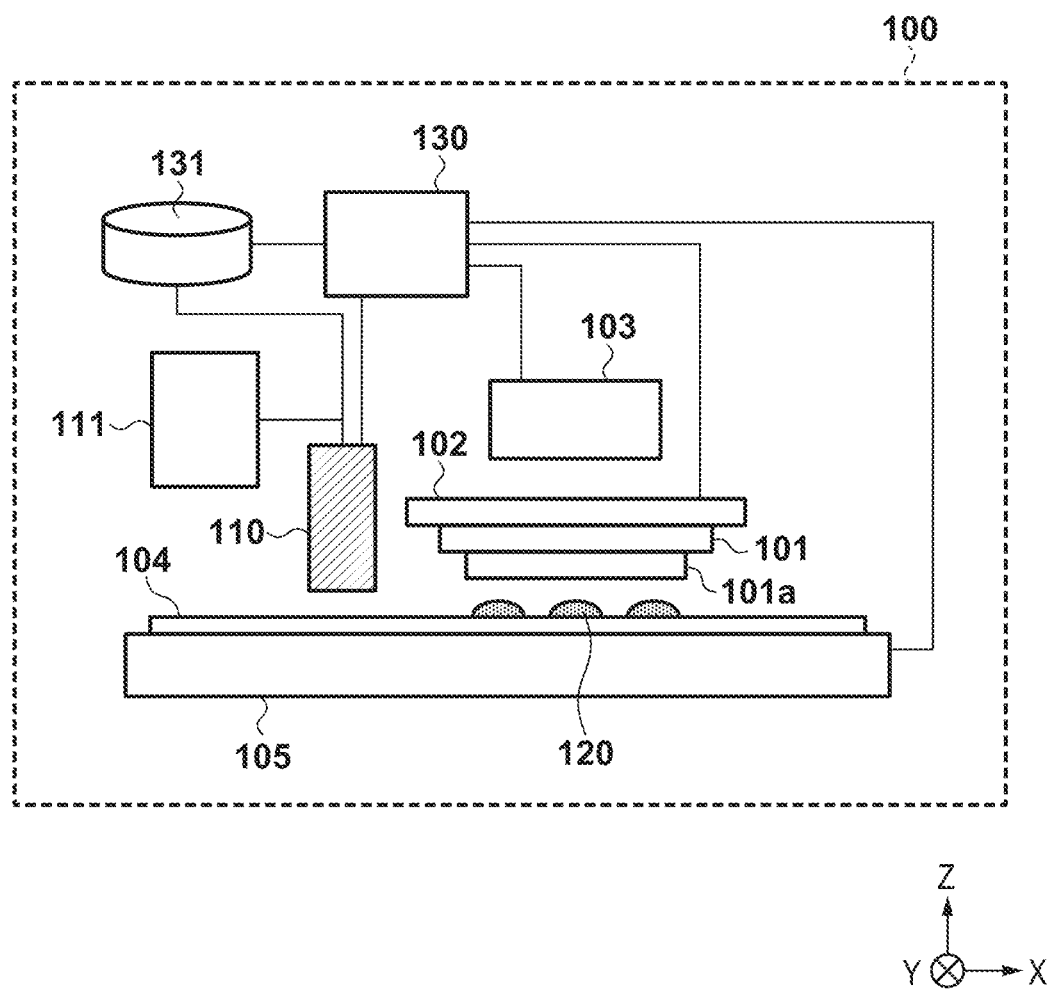
FIG. 2 is a view showing the arrangement of an imprint apparatus according to the embodiment.

FIG. 2 is a view showing the arrangement of the imprint apparatus 100. The imprint apparatus 100 is a lithography apparatus used in a process of manufacturing a semiconductor device or the like and transfers the pattern of the mold onto the substrate. The transfer is performed by molding the imprint material supplied onto a wafer by using the mold and curing the molded imprint material. In this embodiment, the imprint apparatus 100 adopts, as a curing method for the imprint material, a photo-curing method of curing the imprint material by ultraviolet irradiation. However, the curing method is not limited to this and, for example, a heat-curing method using a thermosetting resin as the imprint material can also be adopted.

The imprint apparatus 100 includes a head 102 which holds a mold 101 (original), an ultraviolet irradiator 103, a stage 105 which holds a substrate 104 (wafer), and a dispenser 110 serving as an arrangement unit which arranges the imprint material on the substrate. The imprint apparatus 100 further includes a supply unit 111, a controller 130, and a storage unit 131. The storage unit 131 is a memory unit which stores map information (to be also referred to as a "drop recipe" hereinafter) indicating the arrangement of droplets of the imprint material on the substrate. The map information is created in advance based on design information of the pattern formed in the mold 101, the ideal volumes of the droplets discharged from each nozzle of the dispenser 110, and the like. The storage unit 131 is constituted by, for example, a storage medium such as a hard disk that can be read by the controller 130. The storage unit 131 also stores, for example, a control program regarding an imprint process.

The mold 101 includes, on a surface facing the substrate 104, a pattern portion 101a where a pattern that should be transferred to an imprint material 120 supplied onto the substrate 104 is formed. For example, the mold 101 has a rectangular outer shape and made of a material (such as quartz) which transmits an ultraviolet beam. The head 102 holds (fixes) the mold 101 by a vacuum suction force or an electrostatic force. The head 102 includes a driving mechanism which drives the mold 101 in a z-axis direction.

The substrate 104 is a substrate onto which the pattern of the mold 101 is transferred and includes, for example, a single-crystal silicon wafer, an SOI (Silicon on Insulator) wafer, or the like. The stage 105 includes a substrate chuck which holds the substrate 104, and a driving mechanism configured to perform alignment between the mold 101 and the substrate 104. For example, the driving mechanism is formed by a coarse driving system and a fine driving system, and drives the substrate 104 in an x-axis direction and a y-axis direction. The driving mechanism may have a function of driving the substrate 104 not only in the x-axis direction and the y-axis direction but also in the z-axis direction and a θ direction (rotational direction around a z-axis), and a tilt function of correcting the tilt of the substrate 104.

The supply unit 111 is a tank which stores the imprint material and supplies it to the dispenser 110 via a pipe. Note that the imprint material is a photo-curable composition having the property of being cured by receiving an ultraviolet beam and can be selected appropriately depending on various conditions such as a semiconductor device manufacturing step. The dispenser 110 is a mechanism of dispensing (supplying) the imprint material 120 and includes, for example, a plurality of orifices (nozzles) which discharge the imprint material 120 onto the substrate 104. A unit of the dispensing amount (supply amount) of this dispenser 110 is a "drop". The amount of the imprint material per drop is about several picoliters. A position at which the imprint material can be dropped has a width of several μm. The dispenser 110 arranges the imprint material 120 by moving (scan moving or step moving) the stage 105 while supplying the imprint material 120 from the supply unit 111, thereby forming an imprint material layer on the substrate 104 (a shot region thereof).

The controller 130 includes a CPU and a memory, and controls the overall (operation of the) imprint apparatus 100. The controller 130 controls the respective units of the imprint apparatus 100 and functions as a processing unit which performs the imprint process. The controller 130 performs the following process as the imprint process. First, the controller 130 reads out the drop recipe from the storage unit 131 and sets this in the dispenser 110. The dispenser 110 arranges the imprint material 120 on the substrate in accordance with the drop recipe. The mold 101 is brought into contact with the imprint material 120 arranged on the substrate 104 by an appropriate force (mold contacting). Subsequently, the imprint material 120 is irradiated with light by the ultraviolet irradiator 103 to be cured, and then the mold 101 is separated from the cured imprint material on the substrate 104 (mold separating). With this imprint process, the pattern shape of the mold 101 on the substrate 104 is transferred to one shot region. The controller 130 repeats the above-described imprint process until pattern formation in all shot regions on the substrate is completed. Once pattern formation in all the shot regions is completed, the imprint apparatus 100 unloads and exchanges the substrate. The processed substrate unloaded from the imprint apparatus 100 is loaded to the defect inspection device 300, and a defect inspection can be conducted on the substrate. Here, the defect in the pattern formed in each shot region on the substrate is detected, and defect data containing information on the position coordinates of the detected defect is created.

Figure 3:
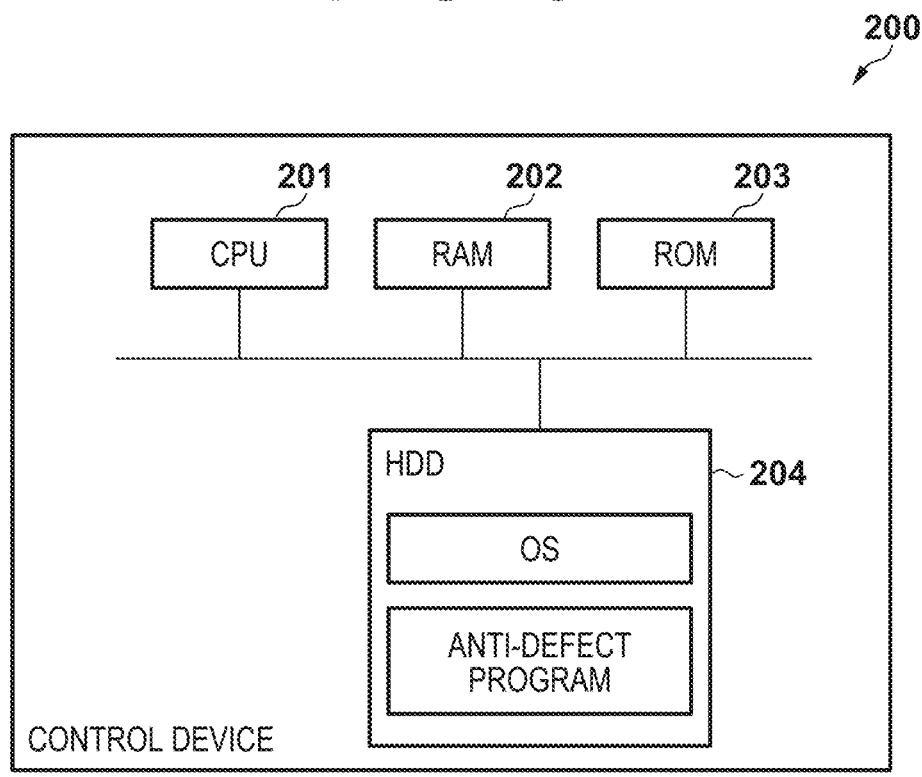
FIG. 3 is a block diagram showing the arrangement of a control device according to the embodiment.

The control device 200 can be constituted by the computer device such as a workstation or a personal computer. More specifically, as shown in FIG. 3, the control device 200 includes, for example, a CPU 201 serving as a processing device, a RAM 202 which provides a data storage area or a program work area, and a ROM 203 which stores an activation program, data, and the like. The control device 200 further includes a storage device 204 such as a hard disk drive (HDD) which stores an operating system (OS), an anti-defect program for performing the defect reduction processing to be described later, and the like. In this embodiment, the control device 200 is provided separately from the imprint apparatus. However, the controller 130 in the imprint apparatus may be configured to carry out all the functions of the control device 200.

The controller 130 or the control device 200 also judges whether to cause the defect inspection device 300 to conduct the defect inspection for the substrate unloaded from the imprint apparatus 100. This judgment can be made based on, for example, an imprint count, the number of substrates on which patterns have been formed in all the shot regions, an elapsed time of the imprint process, or the like.

Figure 4A:
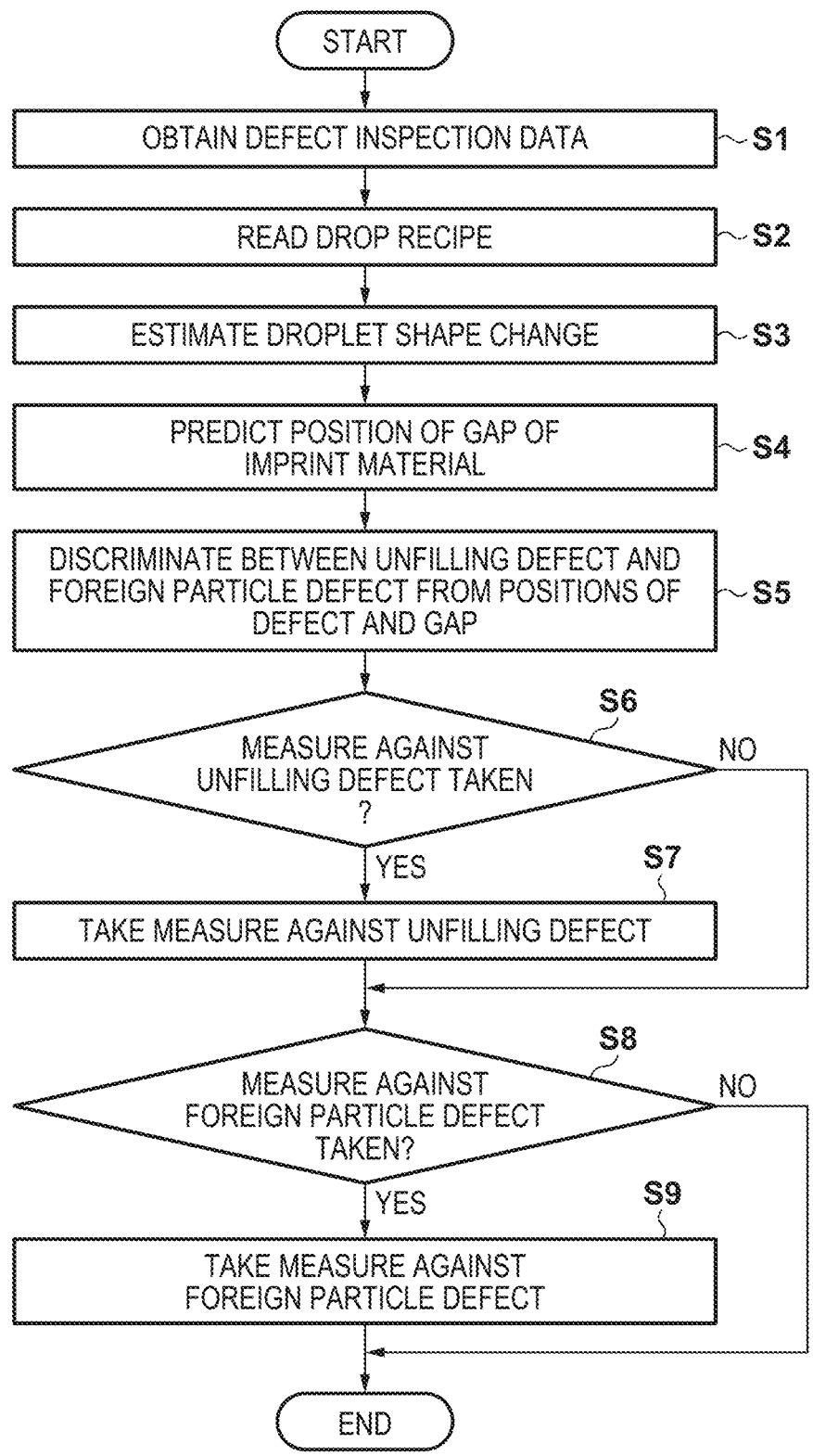
FIGS. 4A and 4B are flowcharts showing a method of taking measures to reduce a pattern defect according to the embodiment.
Figure 4B:
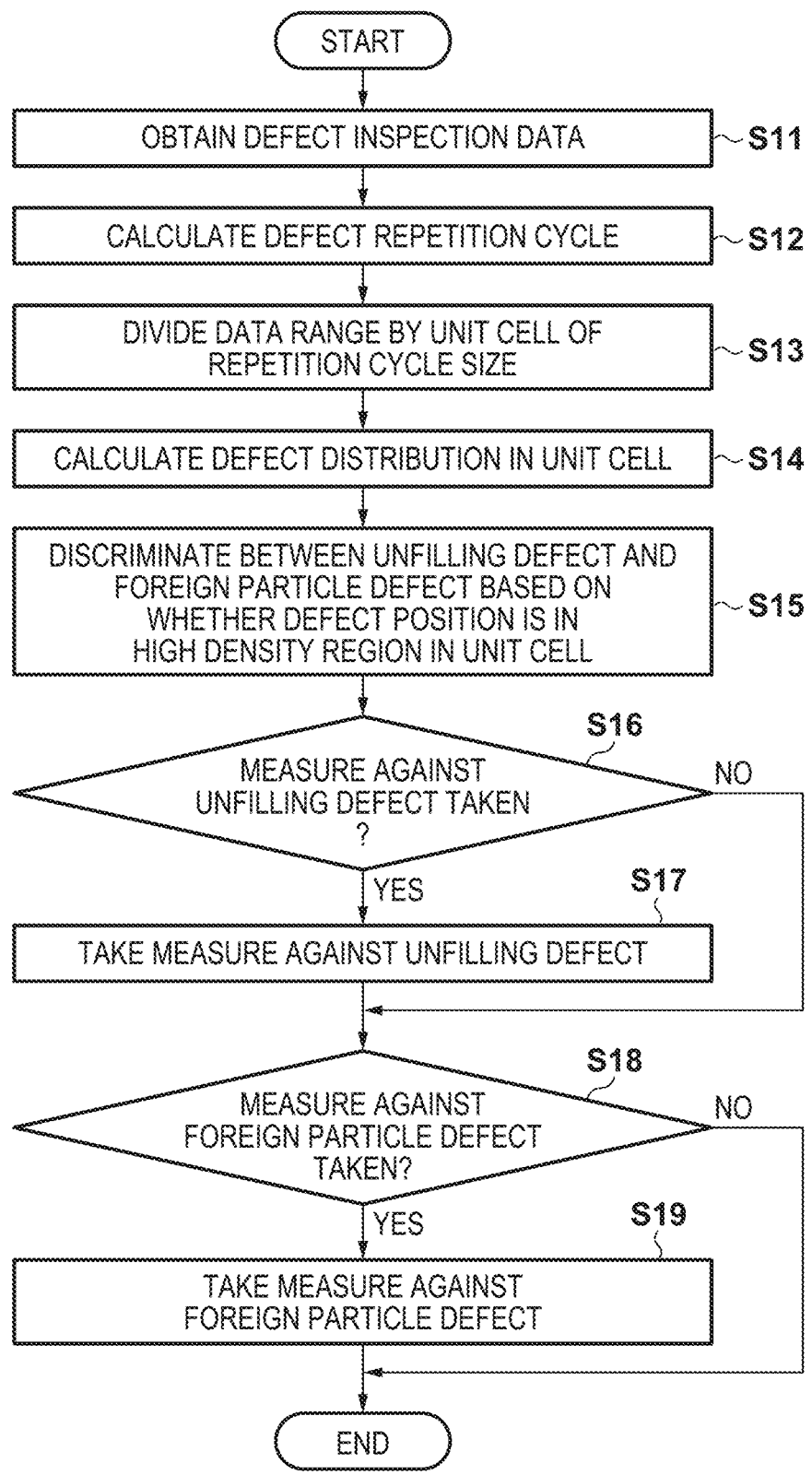

A method of taking measures to reduce a pattern defect will be described below with reference to FIGS. 4A and 4B. This method includes a method of performing the analysis of a defect in a pattern caused on the substrate on which the imprint process has been performed. FIG. 4A is a flowchart in a case in which there is the drop recipe serving as data which designates the droplet arrangement of the imprint material. A case is also considered in which there is no drop recipe, for example, the drop recipe itself is not obtained. FIG. 4B is a flowchart in the case in which there is no drop recipe due to such circumferences. First, a description will be made with reference to FIG. 4A. Note that, for example, the anti-defect program in the storage device 204 of the control device 200 includes a program corresponding to these flowcharts. Then, the CPU 201 can execute that program in response to execution of the defect inspection by the defect inspection device 300, an instruction by a user, or the like. Note that the controller 130 in the imprint apparatus may be configured to perform this method, as described above.

First, the control device 200 obtains defect data from the defect inspection device 300 (step S1). As described above, the defect data contains the information on the position coordinates of the detected defect. Then, the control device 200 reads the drop recipe from the imprint apparatus 100 (step S2).

Figure 5A:
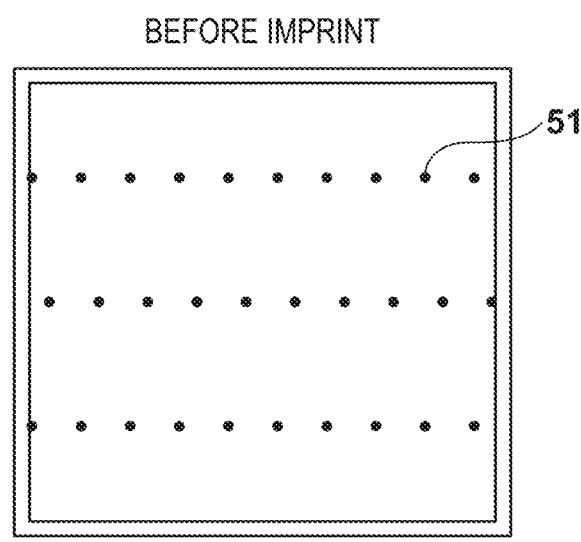
FIGS. 5A to 5C are views for explaining droplet shape changes.
Figure 5B:
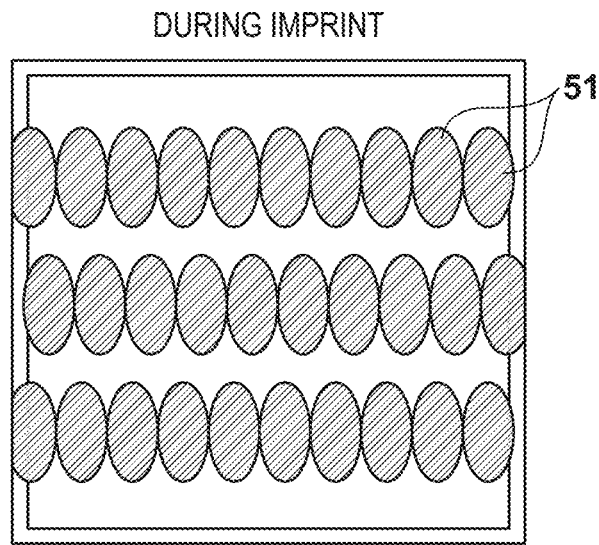
Figure 5C:
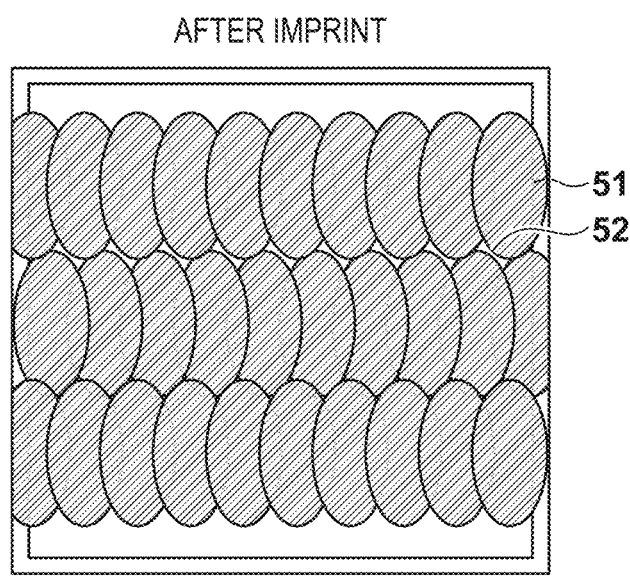

FIG. 5A shows the arrangement of the imprint material before imprinting in one shot region. Droplets 51 of the imprint material are arranged in accordance with the drop recipe. FIGS. 5B and 5C, respectively, show the states of the droplets 51 during mold contacting and at the end of mold contacting. As shown in FIGS. 5A to 5C, the droplets 51 spread as the imprint process proceeds. If gaps 52 in the imprint material, hereinafter referred to as "imprint material gaps", remain at the end of imprint in the process of spreading the imprint material as described above, a defect due to insufficient filling of the imprint material, hereinafter referred to as an "unfilling defect", may be caused owing to this.

To cope with this, the control device 200 estimates information (to be referred to as a "droplet shape change" hereinafter) on how the shape of one droplet changes as imprint proceeds (step S3). According to an experiment or a theoretical consideration, each droplet shape change depends on the shape of the mold, the state of the substrate, a tilt between the mold and the substrate, the physical properties of the imprint material, an atmosphere in the device, or the like. The droplet shape changes can also be obtained by calculation using a fluid simulator or can also be observed by an experiment. For example, if a mask of an L&S (line and space) pattern is used, the imprint material tends to flow in a line direction, and thus each droplet shape expands into an elliptical shape over time.

Figure 6A:
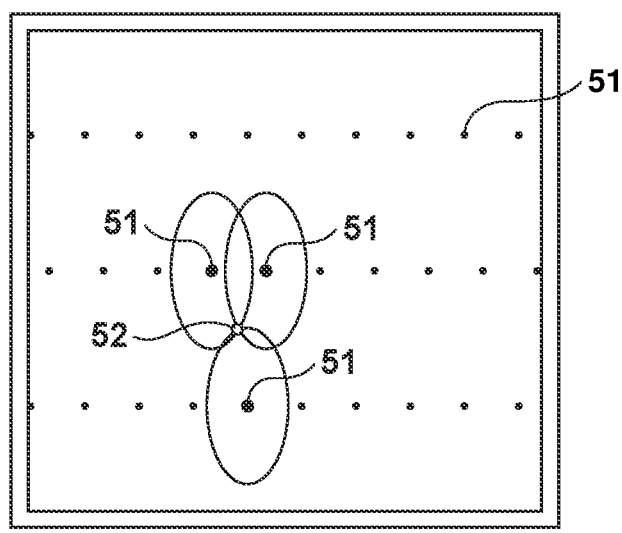
FIGS. 6A to 6C are views for explaining a prediction on positions of gaps in imprint material.
Figure 6B:
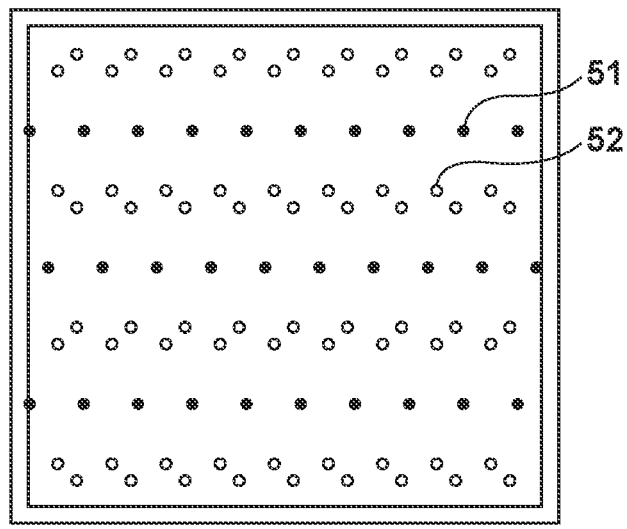

Subsequently, the control device 200 obtains the distribution of the imprint material based on the estimated drop shape change of each droplet and predicts the positions of the imprint material gaps (step S4). FIG. 6A corresponds to FIG. 5A. In FIG. 6A, it is predicted that when adjacent three droplets 51 spread, a final point remaining without being covered with the imprint material becomes the imprint material gap 52. FIG. 6B is obtained by displaying all gaps predicted in the arrangement of the droplets in FIG. 6A.

Figure 6C:
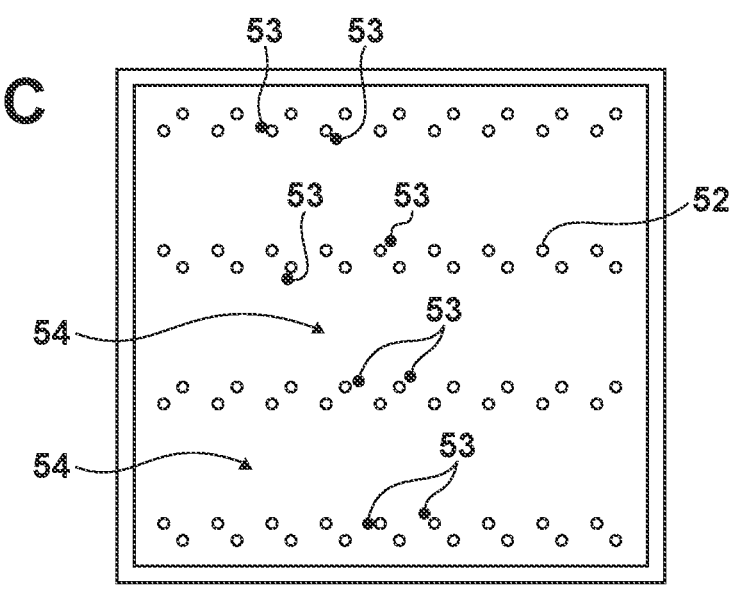

Then, based on a defect position obtain in step S1 and the positions of the imprint gaps predicted in step S4, the control device 200 discriminates between whether respective defects are the unfilling defects and foreign particle defects caused by adhesion of foreign particles (step S5). FIG. 6C shows the imprint material gaps 52 and the defects by overlapping them with each other. It is estimated that the unfilling defects may be caused in the imprint material gaps 52, and it is thus determined that defects near the imprint material gaps 52 are unfilling defects 53. On the other hand, it is estimated that the foreign particle defects are caused independent of the imprint material gaps, and it is thus determined that defects not determined as the unfilling defects (defects far from the positions of the imprint material gaps 52) are foreign particle defects 54. For example, when the distance between the position of each defect of interest and the position of a corresponding one of the imprint material gaps is equal to or smaller than a threshold, it is determined that the defect is the unfilling defect 53, and when the distance is larger than the threshold, it is determined that the defects is the foreign particle defect 54.

Then, based on a discrimination result (for example, the number of defects discriminated as the unfilling defects) in step S5, the control device 200 judges whether to take a measure against the unfilling defects (step S6). If the need for the measure against the unfilling defects is judged, the measure against the unfilling defects is taken (step S7). As the measure against the unfilling defects, for example, at least one of processes selected from the processes including the revision of the drop recipe, the extension of an imprint material filling time (mold contacting time), and the extension of a standby time from the completion of mold contacting to the start of an imprint material curing process is performed.

Then, based on the discrimination result (for example, the number of defects discriminated as the foreign particle defects) in step S5, the control device 200 judges whether to take a measure against the foreign particle defects (step S8). If the need for the measure against the foreign particle defects is judged, for example, a mold cleaning operation is executed as the measure against the foreign particle defects (step S9).

Figure 7:
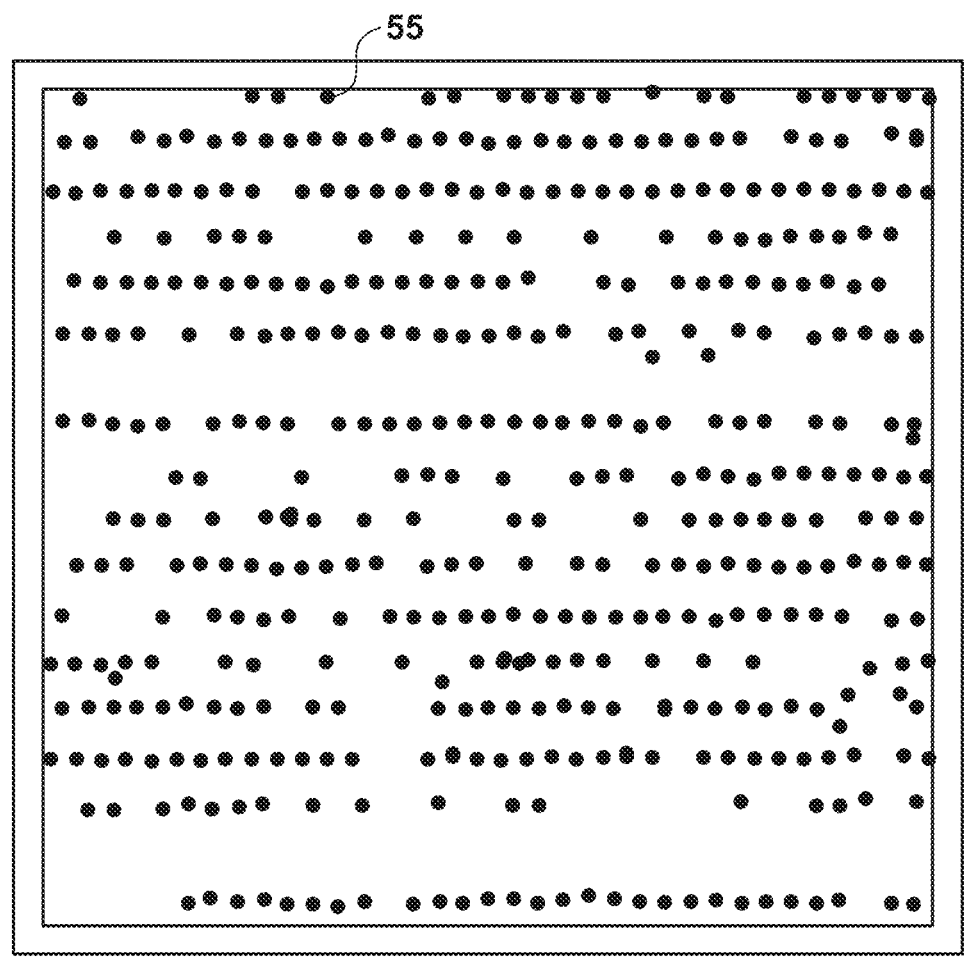
FIG. 7 is a view showing a defect distribution in one shot region.

The flowchart of FIG. 4B on the assumption that there is no drop recipe will now be described. First, the control device 200 obtains the defect data from the defect inspection device 300 (step S11). Then, the control device 200 calculates a defect repetition cycle in both the X and Y directions based on the obtained defect data (step S12). FIG. 7 shows the arrangement of defects 55 (defect distribution) in one shot region specified from the obtained defect data. The arrangement of the droplets is unknown because there is no drop recipe. However, the droplets need to be arranged at a predetermined density in order to uniform a residual layer thickness after imprint. The unfilling defects tend to be caused in portions each having a wide spacing between the droplets. It is thus considered that the droplets are arranged at almost constant spacings so as to eliminate the portions each having an excessive the spacing. That is, it can be assumed that droplets arranged have some periodicity. The unfilling defects tend to be caused in the imprint material gaps, and thus they also have the same periodicity. First, this periodicity is obtained. Let (x, y) be coordinates in the shot region, and P(x, y) be a defect distribution representing a defect distribution. The defect distribution P(x, y) is a function which becomes 0 at a point without any defect and becomes 1 at a point with the defect. In order to obtain the periodicity in this defect distribution P(x, y), autocorrelation functions $S_x(x)$ and $S_y(y)$ are obtained by:

$$\begin{cases} S_x(x) = \int\int P(t, u)P(t+x, u)dtdu \\ S_y(y) = \int\int P(t, u)P(t, u+y)dtdu \end{cases} \quad (1)$$

Figure 8A:
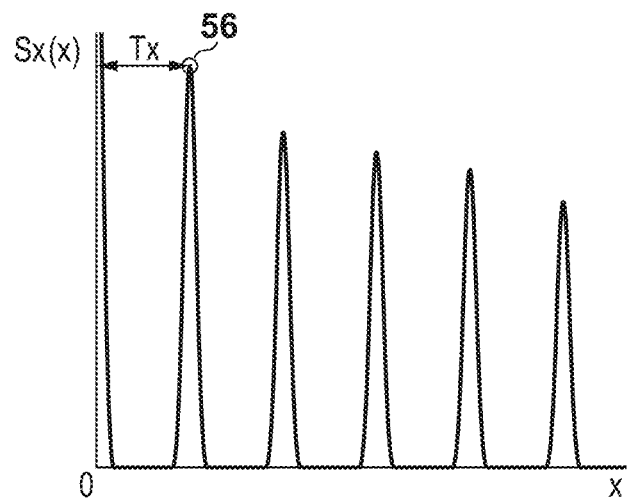
FIGS. 8A and 8B are graphs showing autocorrelation functions of the defect distribution.
Figure 8B:
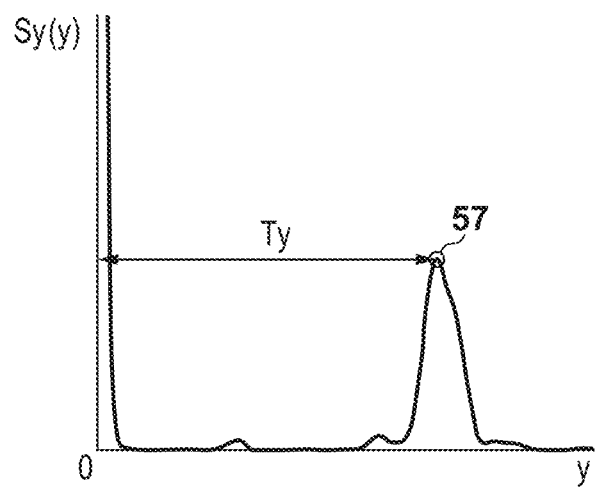

FIGS. 8A and 8B are graphs showing the autocorrelation functions $S_x(x)$ and $S_y(y)$. FIG. 8A shows $S_x(x)$, and an X position at a leftmost peak 56 represents a cycle $T_x$ in an X direction. Similarly, FIG. 8B shows $S_y(y)$, and a Y position at a leftmost peak 57 represents a cycle $T_y$ in a Y direction.

Figure 9:
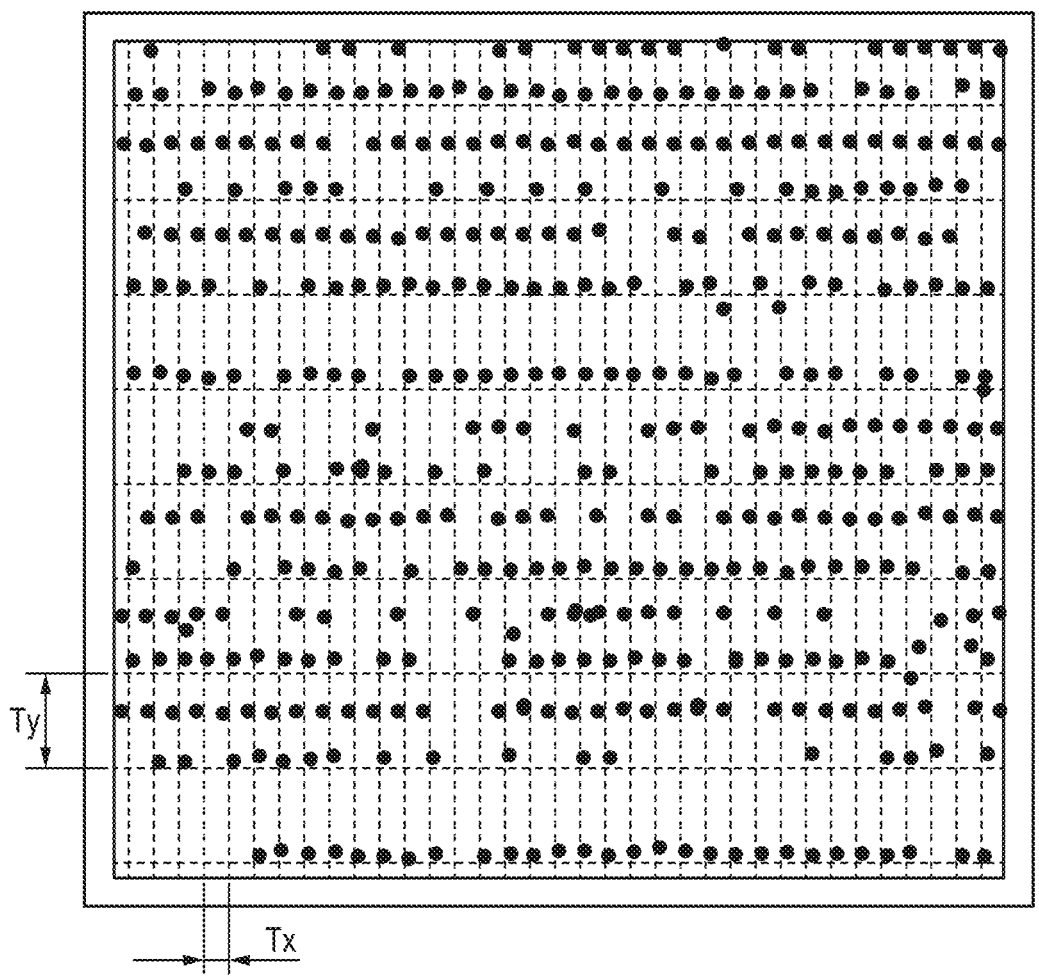
FIG. 9 is a view showing the defect distribution in one shot region divided into regions by unit cells.

Rectangular regions surrounded by $(0 \sim T_x, 0 \sim T_y)$ are called unit cells. The control device 200 divides a data range by these unit cells. FIG. 9 is a view showing the defect distribution (FIG. 7) in one shot region divided into regions by the unit cells.

Subsequently, the control device 200 calculates a defect distribution in each unit cell (step S14). More specifically, the sum of defect values is obtained by superimposing all the unit cells obtained as in FIG. 9. Letting $(X_s, y_s)$ be coordinates in one shot region, and $P_T(X_s, y_s)$ be a defect distribution in the unit cell, the sum of the defect values (defect density distribution) obtained by superimposing all the unit cells is given by:

$$P_T(x_s, y_s) = \sum_{m,n} P(x_s + mT_x, y_s + nT_y) \quad (2)$$

$$\text{for } x_s \equiv x(\text{mod}T_x), y_s \equiv y(\text{mod}T_y)$$

$$x = x_s + mT_x, y = y_s + nT_y$$

FIG. 10 shows an example of the defect density distribution $P_T(X_s, y_s)$.

Then, the control device 200 discriminates between the unfilling defects and the foreign particle defects based on the defect density distribution obtained in step S14 (step S15). For example, in FIG. 10, high density regions 61 represented in black have more defects, and a low density region 62 represented in white has less defects. The high density regions 61 indicate that defect repeatability is high over the entire shot surface. It is estimated that the unfilling defects are caused in the cyclical imprint material gaps, and it is thus determined that the defects belonging to these high density regions 61 are the unfilling defects. On the other hand, it is estimated that the foreign particle defects are caused independent of the imprint material gaps, and it is thus determined that the defects positioned in the low density region 62 having the low repeatability are the foreign particle defects.

Figure 11:
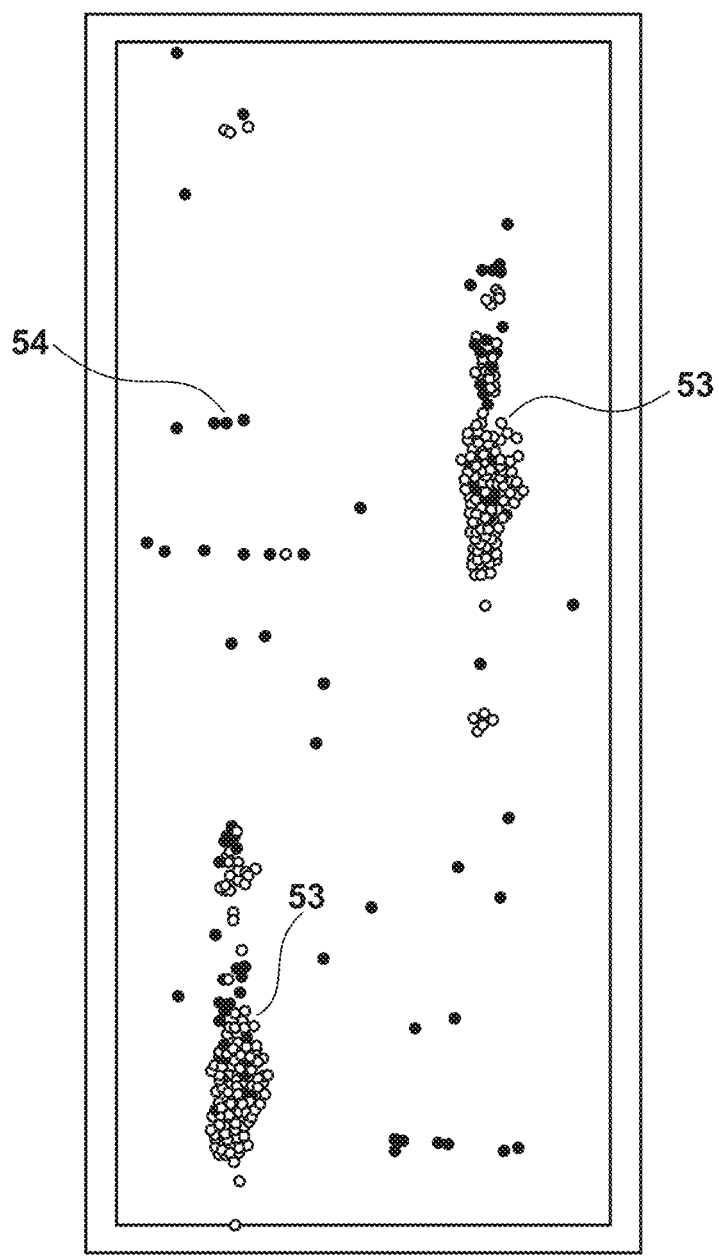
FIG. 11 is a scatter diagram of defects in the unit cell.
Figure 12:
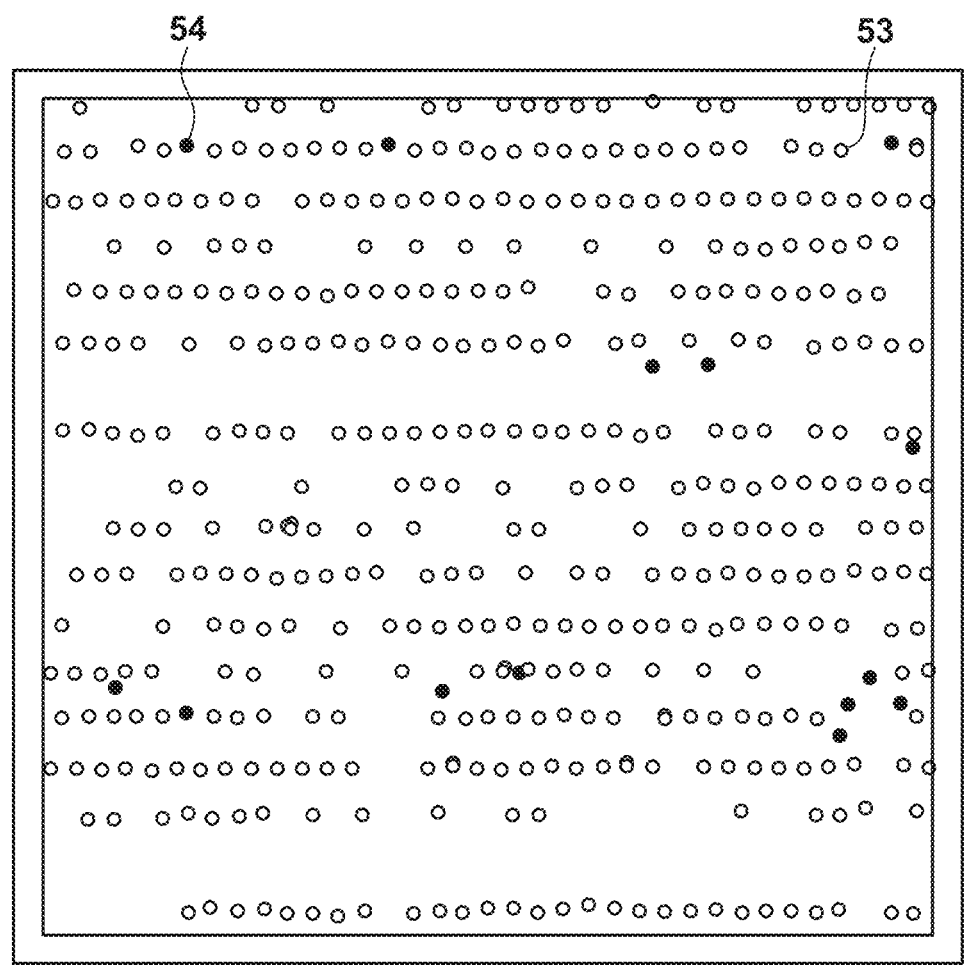
FIG. 12 is a scatter diagram of the defects for each determined type in one shot region.

FIG. 11 is a scatter diagram of the defects for each determined type in one unit cell. Each and every defect is determined as the unfilling defect 53 or the foreign particle defect 54. FIG. 12 is a scatter diagram of the defects for each determined type in one shot region. The respective arrangements of the unfilling defects 53 and the foreign particle defects 54 shown in FIG. 11 are shown by returning the arrangements from the unit cells to the original shot.

Then, based on a discrimination result (for example, the number of defects discriminated as the unfilling defects) in step S15, the control device 200 judges whether to take a measure against the unfilling defects (step S16). If the need for the measure against the unfilling defects is judged, the measure against the unfilling defects is taken (step S17). As the measure against the unfilling defects, for example, at least one of processes selected from the processes including the extension of the imprint material filling time (mold contacting time) and the extension of the standby time from the completion of mold contacting to the start of the imprint material curing process is performed. An example in the case in which there is no drop recipe has been described here. However, if there is an initial reference drop recipe, this reference drop recipe may be revised.

Then, based on the discrimination result (for example, the number of defects discriminated as the foreign particle defects) in step S15, the control device 200 judges whether to take a measure against the foreign particle defects (step S18). If the need for the measure against the foreign particle defects is judged, for example, the mold cleaning operation is executed as the measure against the foreign particle defects (step S19).

Embodiment of Article Manufacturing Method

An article manufacturing method according to an embodiment of the present invention is suitable for manufacturing an article, for example, a microdevice such as a semiconductor device or an element having a microstructure. The article manufacturing method according to this embodiment includes a step of forming a pattern in an imprint material on a substrate using the above-described imprint apparatus (a step of performing an imprint process on the substrate) and a step of processing the substrate on which the pattern has been formed (the substrate on which the imprint process has been performed) in the preceding step. This manufacturing method further includes other known steps (oxidation, deposition, vapor deposition, doping, planarization, etching, resist removal, dicing, bonding, packaging, and the like). The article manufacturing method according to this embodiment is superior to a conventional method in at least one of the performance, quality, productivity, and production cost of the article.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-047366, filed Mar. 10, 2016, which is hereby incorporated by reference herein in its entirety.

What is claimed is:

1. A method of performing an analysis of a defect in a pattern of an imprint material on a substrate during an imprint process, the method comprising:
contacting a pattern of a mold and the imprint material on the substrate to form the pattern of the imprint material on the substrate;
obtaining a defect distribution of the pattern of the imprint material on the substrate;
obtaining map information indicating an arrangement of the imprint material on the substrate; and
determining a type of a defect based on a relationship between a position of the defect in the defect distribution and a position of a gap in the imprint material generated in spreading the imprint material by the imprint process on the substrate, wherein the position of the gap is predicted based on the map information.

2. The method according to claim 1, wherein the determining the type of the defect includes determining that the defect is caused by insufficient filling of the imprint material when a distance between the position of the defect and the position of the gap is within a threshold.

3. The method according to claim 2, wherein the determining the type of the defect further includes determining that the defect is caused by adhesion of foreign particles when the distance is not within the threshold.

4. A method of performing an analysis of a defect in a pattern of an imprint material on a substrate, the method comprising:
contacting a pattern of a mold and the imprint material on the substrate to form the pattern of the imprint material on the substrate;
obtaining a defect distribution of the pattern of the imprint material on the substrate;
calculating a defect repetition cycle in the defect distribution;
dividing the defect distribution into regions by a unit cell having a size of the calculated repetition cycle;
calculating a defect density distribution in the unit cell by superimposing the defect distribution divided into the regions; and
determining a defect type in the defect distribution based on the calculated defect density distribution.

5. The method according to claim 4, wherein the determining the type of the defect includes determining that the defect is caused by insufficient filling of the imprint material if the defect belongs to a high density region in the defect density distribution.

6. The method according to claim 5, wherein the determining the type of the defect further includes determining that the defect is caused by adhesion of foreign particles if the defect does not belong to the high density region.

7. An article manufacturing method comprising:
performing, using an imprint apparatus, an imprint process of transferring a pattern of a mold onto a substrate by bringing the pattern of the mold into contact with an imprint material on the substrate and curing the imprint material;
processing the substrate on which the imprint process has been performed, and
manufacturing the article from the processed substrate,
wherein the imprint apparatus includes
an arrangement unit configured to arrange the imprint material in a shot region on the substrate, and
a controller,
the controller is configured to:
obtain a defect distribution of the pattern on the substrate,
obtain map information indicating an arrangement of the imprint material on the substrate, and
determine a type of a defect based on a relationship between a position of the defect in the defect distribution and a position of a gap in the imprint material generated in a process of spreading the imprint material by the imprint process, wherein the position of the gap is predicted based on the map information.

* * * * *